United States Patent
Mathur et al.

(10) Patent No.: US 10,497,414 B1
(45) Date of Patent: Dec. 3, 2019

(54) CIRCUITRY FOR TRACKING BIAS VOLTAGE BEHAVIOR

(71) Applicant: Arm Limited, Cambridge (GB)

(72) Inventors: Rahul Mathur, Austin, TX (US); Rajesh Reddy Challa, Austin, TX (US); Gaurang Prabhakar Narvekar, Austin, TX (US)

(73) Assignee: Arm Limited, Cambridge (GB)

( * ) Notice: Subject to any disclaimer, the term of this patent is extended or adjusted under 35 U.S.C. 154(b) by 0 days.

(21) Appl. No.: 16/003,996

(22) Filed: Jun. 8, 2018

(51) Int. Cl.
- *G11C 5/14* (2006.01)
- *G11C 7/22* (2006.01)
- *G11C 8/08* (2006.01)
- *G11C 7/12* (2006.01)

(52) U.S. Cl.
CPC ............... *G11C 7/227* (2013.01); *G11C 7/12* (2013.01); *G11C 8/08* (2013.01)

(58) Field of Classification Search
CPC .............. G11C 7/227; G11C 7/12; G11C 8/08
USPC .......................................... 365/189.15, 210.1
See application file for complete search history.

(56) References Cited

U.S. PATENT DOCUMENTS

| | | | | |
|---|---|---|---|---|
| 5,268,869 A * | 12/1993 | Ferris | ........................ | G11C 7/14 365/205 |
| 5,414,663 A * | 5/1995 | Komarek | ............... | G11C 7/062 257/E27.103 |
| 7,746,716 B2 * | 6/2010 | Jetton | ..................... | G11C 7/227 365/205 |
| 8,467,257 B1 * | 6/2013 | Liu | ........................ | G11C 7/065 365/154 |
| 9,418,716 B1 * | 8/2016 | Pallerla | ..................... | G11C 7/22 |
| 9,858,988 B1 * | 1/2018 | Ghosh | .................. | G11C 11/419 |
| 9,928,889 B1 * | 3/2018 | Narasimhan | ............. | G11C 7/12 |
| 9,997,217 B1 * | 6/2018 | Goel | ......................... | G11C 7/12 |
| 10,147,482 B2 * | 12/2018 | Dasani | .................. | G11C 11/419 |
| 10,217,506 B1 * | 2/2019 | Asthana | ................ | G11C 11/418 |
| 2003/0206448 A1 * | 11/2003 | Sung | ........................ | G11C 7/06 365/189.07 |
| 2009/0231934 A1 * | 9/2009 | Jung | ........................ | G11C 7/08 365/189.15 |
| 2010/0046309 A1 * | 2/2010 | Rengarajan | .............. | G11C 7/12 365/203 |
| 2012/0224405 A1 * | 9/2012 | Tanaka | ..................... | G11C 8/08 365/72 |
| 2015/0277770 A1 * | 10/2015 | Tsai | ........................ | G11O 5/025 711/104 |
| 2018/0144780 A1 * | 5/2018 | Kwon | ..................... | G11C 7/227 |
| 2018/0268894 A1 * | 9/2018 | Dasani | ................... | G11C 7/227 |
| 2019/0057735 A1 * | 2/2019 | Akkur | .................. | G11C 11/419 |

\* cited by examiner

*Primary Examiner* — Viet Q Nguyen
(74) *Attorney, Agent, or Firm* — Pramudji Law Group PLLC; Ari Pramudji

(57) ABSTRACT

Various implementations described herein refer to an integrated circuit having dummy wordline driver circuitry coupled to a dummy wordline and dummy bitline pulldown circuitry coupled between a dummy bitline and the dummy wordline. The integrated circuit may include dummy wordline tracking circuitry coupled to the dummy wordline between the dummy wordline driver circuitry and the dummy bitline pulldown circuitry. The dummy wordline tracking circuitry may have one or more variable capacitors that are coupled between the dummy wordline and a variable voltage source.

16 Claims, 5 Drawing Sheets

CIRCUITRY FOR TRACKING BIAS VOLTAGE BEHAVIOR

BACKGROUND

This section is intended to provide information relevant to understanding the various technologies described herein. As the section's title implies, this is a discussion of related art that should in no way imply that it is prior art. Generally, related art may or may not be considered prior art. It should therefore be understood that any statement in this section should be read in this light, and not as any admission of prior art.

Generally, the switching behavior of a transistor, such as, e.g., a metal-oxide-semiconductor field effect transistor (MOSFET), is affected by the parasitic capacitances between the device's three terminals, that is, gate-to-source (CGS), gate-to-drain (CGD) and drain-to-source (CDS) capacitances. These capacitance values are non-linear and a function of the device structure, geometry, and bias voltages. The capacitances come from a series combination of a bias independent oxide capacitance and a bias dependent depletion (Silicon) capacitance. Also, the input capacitance (CGD+CGS) may decrease with increasing voltage at shorted drain/source terminals due to a decrease in depletion capacitance, as voltage increases and the depletion region widens. Also, the lower the input capacitance, the faster the switching speed.

BRIEF DESCRIPTION OF THE DRAWINGS

Implementations of various techniques are described herein with reference to the accompanying drawings. It should be understood, however, that the accompanying drawings illustrate only various implementations described herein and are not meant to limit embodiments of various techniques described herein.

DETAILED DESCRIPTION

Various implementations described herein are directed to integrated circuitry for tracking bias voltage behavior in various memory related applications. For instance, various implementations described herein refer to tracking circuitry that utilizes changes in transistor switching behavior with different bias voltages in various memory self-timing applications. In some instances, transistor switching behavior may refer to the switching behavior of the metal-oxide-semiconductor field-effect transistor (MOSFET).

Various implementations of tracking circuitry will now be described in detail herein with reference to FIGS. 1-5.

Figure 1:
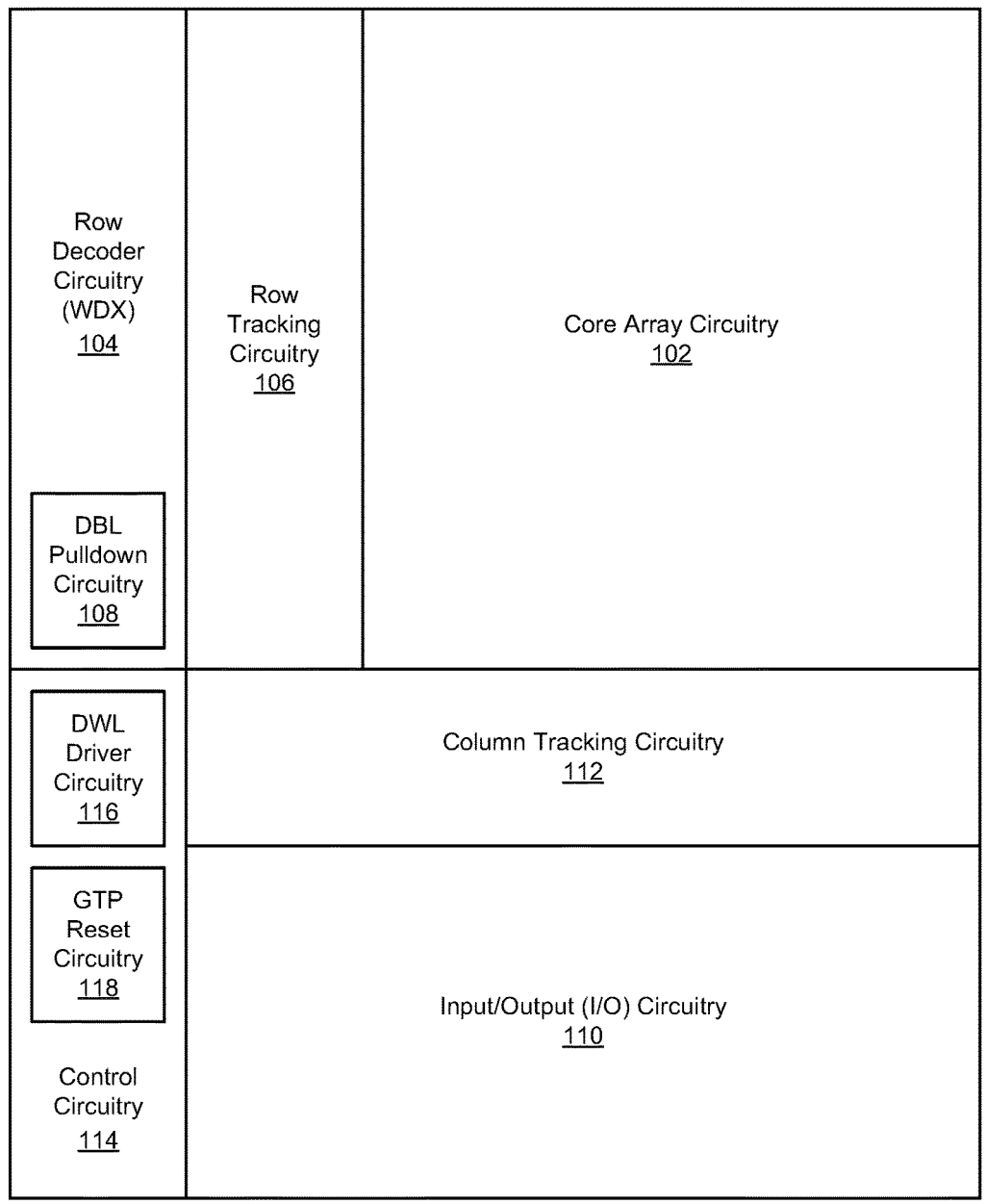
FIG. 1 illustrates a diagram of memory circuitry having row tracking logic and column tracking logic in accordance with various implementations described herein.

FIG. 1 illustrates a diagram of memory circuitry 100 having row tracking logic circuitry 106 and column tracking logic circuitry 112 in accordance with implementations described herein. As also shown in FIG. 1, the memory circuitry 100 also includes core circuitry 102 having multiple bitcell arrays that may be implemented with a single bank of bitcells and/or multiple banks of bitcells.

The memory circuitry 100 may be implemented as an integrated circuit (IC) with various types of memory, such as, e.g., random access memory (RAM), including static RAM (SRAM), and/or any other types of volatile memory. In various implementations, the memory circuitry 100 may be implemented as an integrated circuit (IC) with single or dual rail memory architecture along with any other related circuitry. The memory circuitry 100 may be integrated with computing circuitry and related components on a single chip, such as, e.g., system-on-a-chip (SoC). Further, the memory circuitry 100 may be implemented in embedded systems for various electronic and mobile applications, including low power sensor nodes for IoT (Internet of things) applications.

As shown in FIG. 1, the memory circuitry 100 includes memory, such as, e.g., core circuitry 102 having multiple bitcell arrays, wherein each bitcell array may include multiple bitcells, and each bitcell may be referred to as a memory cell, and each bitcell may be configured to store at least one data bit value (e.g., data value related to a logical '0' or '1'). Also, each bitcell array may include any number of bitcells arranged in various configurations, such as, e.g., a two-dimensional (2D) memory array having any number of columns and any number of rows of multiple bitcells, which may be arranged in a 2D grid pattern with 2D indexing capabilities. Further, each bitcell may be implemented with random access memory (RAM) circuitry, and/ or some other type of volatile type memory, as applicable. For instance, each bitcell may include a multi-transistor static RAM (SRAM) cell, including various types of SRAM cells, such as, e.g., 6T CMOS SRAM and/or other types of complementary MOS (CMOS) SRAM cells, such as, e.g., 4T, 8T, 10T, or more transistors per bit. In some instances, the memory circuitry 100 may operate at a source voltage level VDD with a voltage range that varies with technology.

The memory circuitry 100 may include wordline (WL) row decoder circuitry 106 that accesses each of the bitcells via a selected wordline (WL) that is driven by wordline driver circuitry. The combination of the WL decoder circuitry 106 and WL driver may be referred to as (WDX). The memory circuitry 100 (including the core circuitry 102, bitcells, and the row decoder circuitry 106) may operate at a first supply voltage (Vdd), such as, e.g., core supply voltage (Vddc), wherein voltage range varies with technology. In other instances, the row decoder circuitry 106 may operate at the core supply voltage (Vddc), and some other components, such as, e.g., WL driver circuitry may generate a wordline signal at a second supply voltage that may be different than the first or core supply voltage (Vddc), such as, e.g., a periphery supply voltage (Vddp).

As also shown in FIG. 1, the memory circuitry 100 may include row tracking circuitry 106. In some implementations, the row tracking circuitry 106 may refer to row tracking cells that include one or more variable capacitors that may be used to mimic the bitline load seen by the bitline (BL). Further, in some implementations, the row tracking circuitry 106 may refer to dummy bitline circuitry having dummy bitline (DBL) tracking logic that is implemented as dummy bitline tracking circuitry 302 in reference to FIG. 3, as described herein below. The memory circuitry 100 may include dummy bitline pulldown circuitry 108, which may be implemented as part of the row decoder circuitry 104.

The memory circuitry 100 may include periphery circuitry having control circuitry 114 and column decoder circuitry, such as, e.g., input/output (I/O) circuitry 110 that may be used to access each of the bitcells via one or more selected bitlines BL, . . . , BLn. In some instances, selected bitlines BL, . . . , BLn include a selected pair of complementary bitlines BL/NBL, . . . , BLn/NBLn. In other instances, the periphery circuitry may include the row decoder 106 coupled to wordline driver circuitry and column decoder circuitry to select at least one bitcell in the arrays 102 of bitcells with a wordline (WL) signal and a bitline (BL) signal. Further, the periphery circuitry may operate at the periphery supply voltage (Vddp), which is different than the core supply voltage (Vddc).

As shown in FIG. 1, the memory circuitry 100 may include column tracking circuitry 112. In some implementations, the column tracking circuitry 112 may refer to column tracking cells that include one or more variable capacitors that are used to mimic the wordline load seen by the wordline (WL). Also, in some implementations, the column tracking circuitry 112 may refer to dummy wordline circuitry having dummy wordline (DWL) tracking logic that may be implemented as dummy wordline tracking circuitry 202 in reference to FIG. 2, as described herein below. The memory circuitry 100 may include dummy wordline driver circuitry 116 and global timing pulse (GTP) reset circuitry 118, which may be implemented as part of the control circuitry 114.

Figure 2:
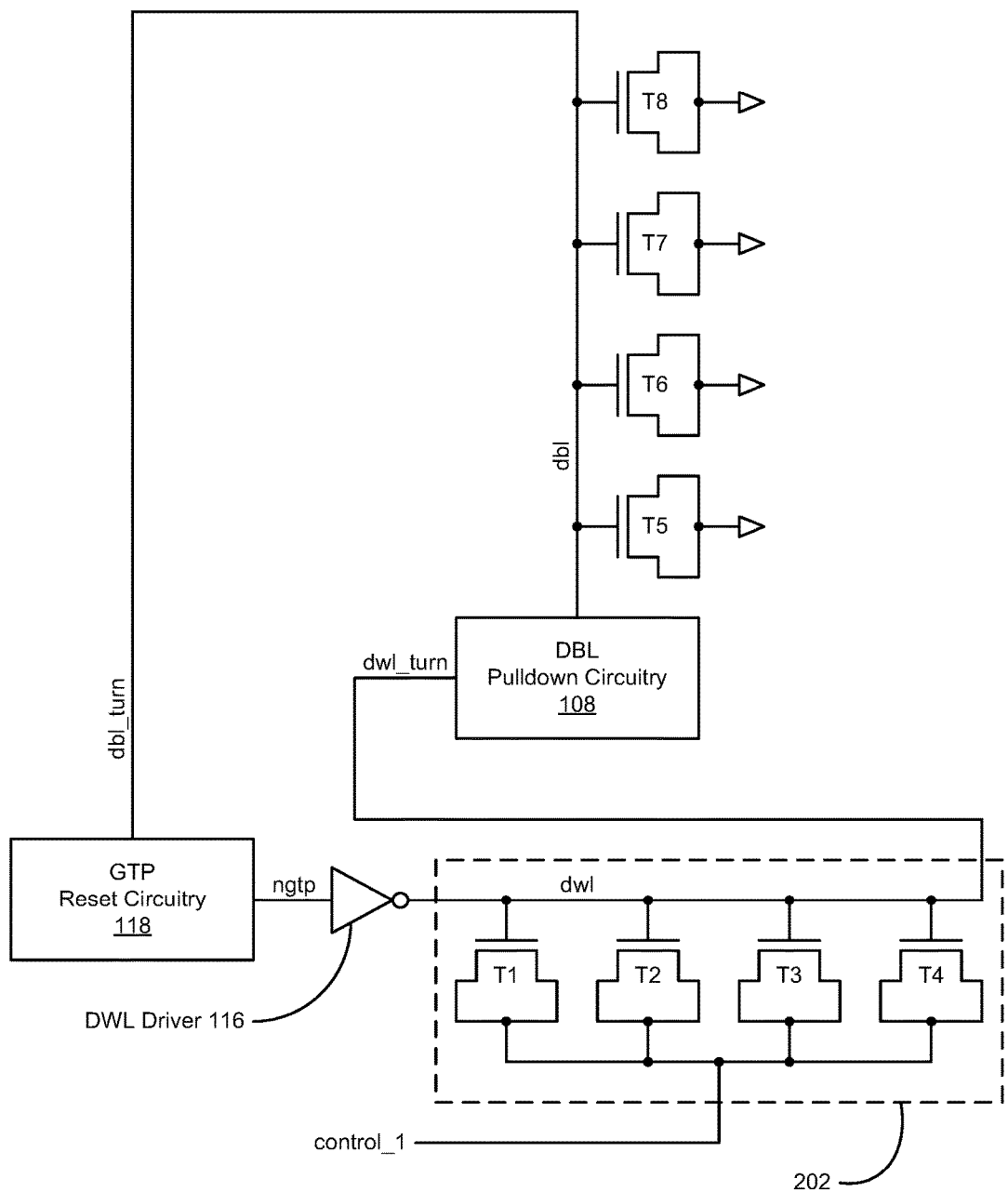
FIG. 2 illustrates a diagram of dummy wordline circuitry having tracking logic in accordance with various implementations described herein.

FIG. 2 illustrates a diagram of dummy wordline circuitry 200 having dummy wordline (DWL) tracking logic in accordance with implementations described herein. One or more various components that are described in FIG. 2 are similar in scope, function, and operation as described in reference to the circuitry 100 as shown in FIG. 1.

As shown in FIG. 2, the dummy wordline circuitry 200 includes dummy bitline pulldown circuitry 108, dummy wordline driver circuitry 116, and global timing pulse (GTP) reset circuitry 118 that are coupled together with a dummy wordline (dwl) and a dummy bitline (dbl). In some implementations, the dummy wordline driver circuitry 116 may be coupled to the dummy wordline (dwl). The dummy bitline pulldown circuitry 108 may be coupled between the dummy bitline (dbl) and the dummy wordline (dwl). The global timing pulse (GTP) reset circuitry 118 may be coupled between the dummy bitline pulldown circuitry 108 and the dummy wordline driver circuitry 116.

In some implementations, during operation, the global timing pulse (GTP) reset circuitry 118 may receive a dbl_turn signal from the dummy bitline pulldown circuitry 108 via the dummy bitline (dbl). In this instance, the global timing pulse (GTP) reset circuitry 118 may provide a complementary global timing pulse signal (ngtp) to the dummy wordline driver circuitry 116 based on the dbl_turn signal. The dummy wordline driver circuitry 116 may be implemented with an inverter to drive the dummy wordline (dwl). In this instance, the dummy wordline driver circuitry 116 receives the complementary global timing pulse signal (ngtp) and provides an inverted ngtp signal (gtp signal) as a dwl_turn signal to the dummy bitline pulldown circuitry 108 via the dummy wordline (dwl). Based on the received dwl_turn signal, the dummy bitline pulldown circuitry 108 provides the dbl_turn signal to the global timing pulse (GTP) reset circuitry 118 via the dummy bitline (dbl).

The dummy wordline circuitry 200 includes tracking logic that is implemented as dummy wordline tracking circuitry 202, which may be coupled to the dummy wordline (dwl) between the dummy wordline driver circuitry 116 and the dummy bitline pulldown circuitry 108. The dummy wordline tracking circuitry 202 may include dummy wordline tracking cells that include one or more variable capacitors that are used to mimic the wordline load seen by the wordline (WL). For instance, the dummy wordline tracking circuitry 202 may include one or more variable capacitors (T1, T2, T3, T4) that are coupled between the dummy wordline (dwl) and a variable voltage source (control_1), which may be referred to a first variable voltage source. The one or more variable capacitors (T1, T2, T3, T4) may be used for switching between multiple capacitance values, and switching may be achieved and/or performed dynamically. Switching between multiple capacitance values may occur at any time within a memory operation cycle. In some instances, the variable voltage source (control_1) may refer to a control signal that is implemented with a variable source voltage supply (Vdd). In other instances, the variable voltage source may be implemented with a variable ground voltage supply (Vss).

In some implementations, the one or more variable capacitors (T1, T2, T3, T4) may have a first terminal that is coupled to the dummy wordline (dwl). The one or more variable capacitors (T1, T2, T3, T4) may have a second terminal that is coupled to the variable voltage source (control_1) to receive at least one control signal that switches between a first state and a second state that is different than the first state. For instance, in the first state, the one or more variable capacitors (T1, T2, T3, T4) may have a first variable capacitance value that is high in capacitance. Also, in another instance, in the second state, the one or more variable capacitors (T1, T2, T3, T4) may have a second variable capacitance value is low in capacitance.

In some implementations, as also shown in FIG. 2, the one or more variable capacitors (T1, T2, T3, T4) may be implemented with a transistor that is coupled together to operate as a capacitor. The transistor may be implemented with a MOSFET, such as, e.g., an n-type MOSFET (nMOSFET). However, in some other scenarios, the transistor may also be implemented with a p-type MOSFET (pMOSFET). Further, the one or more variable capacitors (T1, T2, T3, T4) have a first terminal that is a gate of the transistor, and the one or more variable capacitors (T1, T2, T3, T4) may have a second terminal that is a source/drain connection of the transistor. In other implementations, the one or more variable capacitors (T1, T2, T3, T4) may be implemented with a capacitor.

In reference to various operational applications of FIG. 2, the tracking circuitry 202 includes the dummy word line (DWL) and the dummy bit line (DBL) with minimal slack time to trigger the fall of the internal memory clock (GTP) for self-timing. During read or write operations, the rise of the external clock signal from the SoC triggers the fall of the NGTP and rise of GTP, wherein NGTP fall triggers DWL rise, and the DWL signal travels in the direction of the actual wordline through the 10s. The tracking circuitry 202 seeks to mimic the DWL routing and load in the IOs to that seen by the actual wordline (WL) in the bitcells. The DWL signal returning from the IOs is referred to as the DWL_TURN, which triggers the DBL fall, wherein the DBL signal is loaded with capacitance to match that seen by the actual bitline (BL) in the bitcell. For reference, the NGTP is one stage before the GTP, and the GTP is the memory self-time pulse. Also, the DWL_TURN refers to the DWL signal returning after turning around in the memory 10s.

Figure 3:
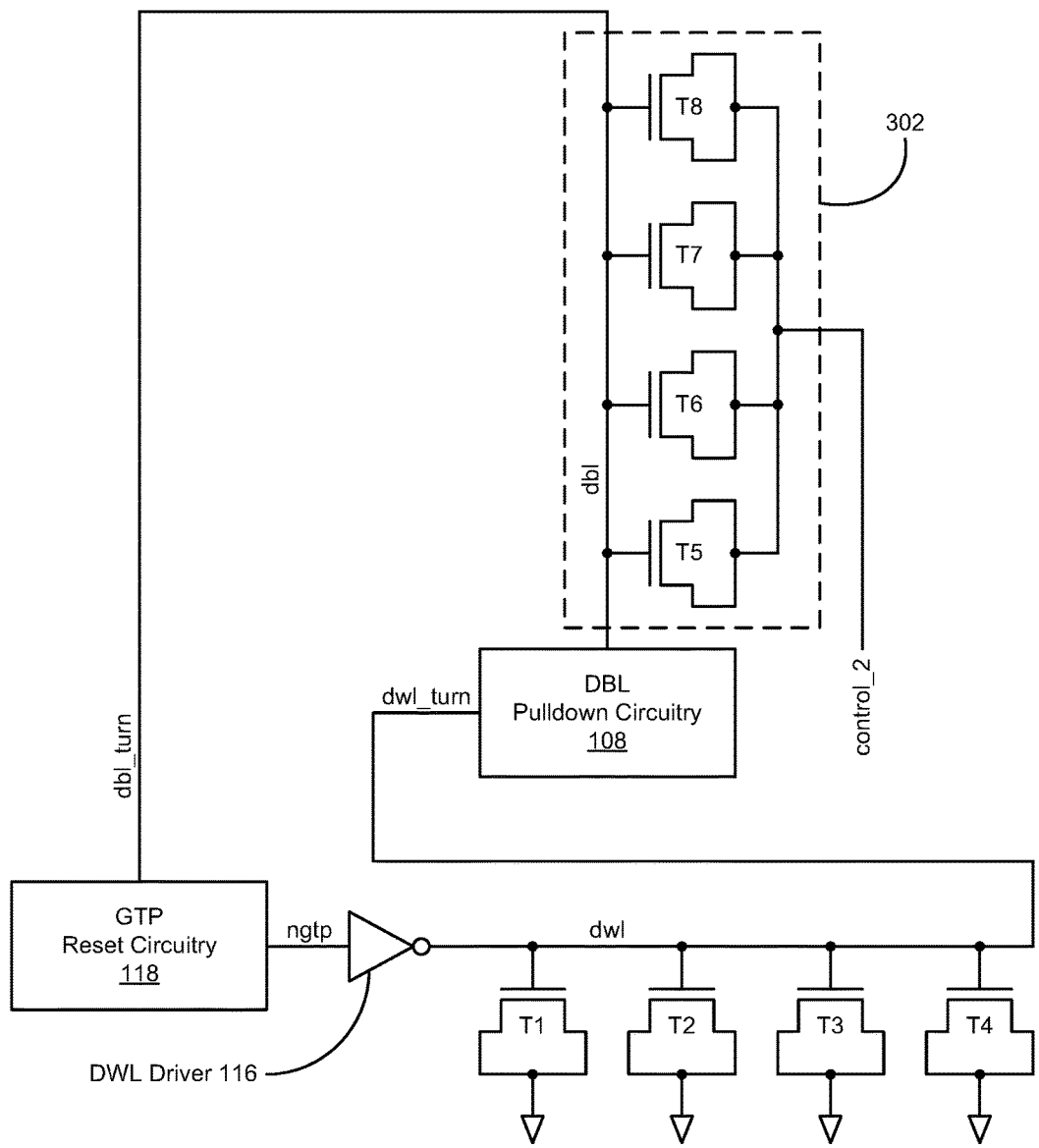
FIG. 3 illustrates a diagram of dummy bitline circuitry having tracking logic in accordance with various implementations described herein.

FIG. 3 illustrates a diagram of dummy bitline circuitry 300 having dummy bitline (DBL) tracking logic in accordance with implementations described herein. Various components that are described in FIG. 3 are similar in scope, function, and operation as described in reference to the circuitry 200 as shown in FIG. 2.

As shown in FIG. 3, the dummy bitline circuitry 300 may include the dummy bitline pulldown circuitry 108 that is coupled to the dummy bitline (dbl). The dummy bitline circuitry 300 may include the global timing pulse (GTP) reset circuitry 118 that is coupled between the dummy wordline (dwl) and the dummy bitline (dbl).

The dummy bitline circuitry 300 may include dummy bitline tracking circuitry 302 that is coupled to the dummy bitline (dbl) between the dummy bitline pulldown circuitry 108 and the global timing pulse (GTP) reset circuitry 118. The dummy bitline tracking circuitry 302 may include dummy bitline tracking cells that include one or more variable capacitors that are used to mimic the bitline load seen by the bitline (BL). For instance, the dummy bitline tracking circuitry 302 may include one or more variable capacitors (T5, T6, T7, T8) that are coupled between the dummy bitline (dbl) and a variable voltage source (control_2), which may be referred to a second variable voltage source. The one or more variable capacitors (T5, T6, T7, T8) may be used for dynamically switching between multiple capacitance values at any time within a memory operation cycle. Also, the variable voltage source (control_2) refers to another control signal that is implemented with a variable source voltage supply (Vdd). In some other instances, the variable voltage source may be implemented with a variable ground voltage supply (Vss).

In some implementations, the one or more variable capacitors (T5, T6, T7, T8) may have a first terminal that is coupled to the dummy bitline (dbl). The one or more variable capacitors (T5, T6, T7, T8) may have a second terminal that is coupled to the variable voltage source (control_2) to receive at least one control signal that switches between a first state and a second state that is different than the first state. For instance, in the first state, the one or more variable capacitors (T5, T6, T7, T8) may have a first variable capacitance value that is high in capacitance. Also, in another instance, in the second state, the one or more variable capacitors (T5, T6, T7, T8) may have a second variable capacitance value is low in capacitance.

In some implementations, as also shown in FIG. 2, the one or more variable capacitors (T5, T6, T7, T8) may be implemented with a transistor that is coupled together to operate as a capacitor. The transistor may be implemented with a MOSFET, such as, e.g., an n-type MOSFET (nMOSFET). However, in some other scenarios, the transistor may also be implemented with a p-type MOSFET (pMOSFET). Further, the one or more variable capacitors (T5, T6, T7, T8) have a first terminal that is a gate of the transistor, and the one or more variable capacitors (T5, T6, T7, T8) may have a second terminal that is a source/drain connection of the transistor. In other implementations, the one or more variable capacitors (T5, T6, T7, T8) may be implemented with a capacitor.

Figure 4:
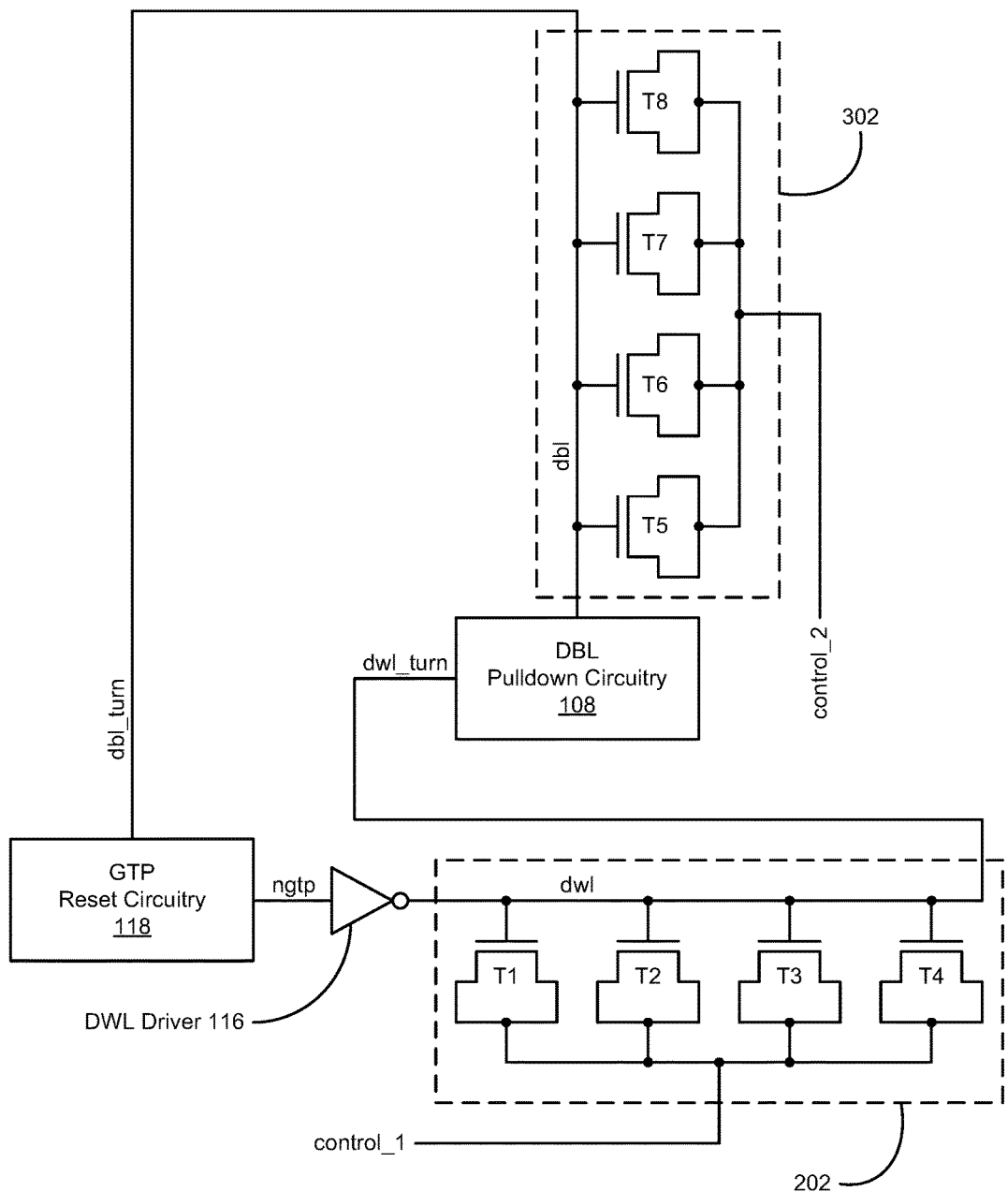
FIG. 4 illustrates a diagram of dummy wordline/bitline circuitry having tracking logic in accordance with various implementations described herein.

FIG. 4 illustrates a diagram of dummy wordline/bitline circuitry having tracking logic in accordance with various implementations described herein. Various components that are described in FIG. 4 are similar in scope, function, and operation as described in reference to the circuitry 200, 300 as shown in FIGS. 2 and 3, respectively.

As shown in FIG. 4, the dummy bitline circuitry 400 may include the dummy wordline driver circuitry 116 that is coupled to the dummy wordline (dwl). The dummy bitline circuitry 400 may include the dummy bitline pulldown circuitry 108 that is coupled between the dummy bitline (dbl) and the dummy wordline (dwl). The dummy bitline circuitry 400 may include the global timing pulse (GTP) reset circuitry 118 that is coupled between the dummy wordline (dwl) and the dummy bitline (dbl).

The dummy bitline circuitry 400 may include the dummy wordline tracking circuitry 202 that is coupled to the dummy wordline (dwl) between the dummy wordline driver circuitry 116 and the dummy bitline pulldown circuitry 108. As shown, the dummy wordline tracking circuitry 202 may include at least one first variable capacitor (T1, T2, T3, T4) that is coupled between the dummy wordline (dwl) and the first variable voltage source (control_1).

The dummy bitline circuitry 400 may include the dummy bitline tracking circuitry 302 that is coupled to the dummy bitline (dbl) between the dummy bitline pulldown circuitry 108 and the global timing pulse (GTP) reset circuitry 118. As shown, the dummy bitline tracking circuitry 302 may include at least one second variable capacitor (T5, T6, T7, T8) that is coupled between the dummy bitline (dbl) and the second variable voltage source (control_2). As described herein, the first variable voltage source (control_1) may refer to the variable source voltage supply (Vdd) or the variable ground voltage supply (Vss), and the second variable voltage source (control_2) may also refer to the variable source voltage supply (Vdd) or the variable ground voltage supply (Vss).

In some implementations, the at least one first variable capacitor (T1, T2, T3, T4) and the at least one second variable capacitor (T5, T6, T7, T8) may be implemented with a transistor that is coupled together to operate as a capacitor. Also, the at least one variable capacitor (T1, T2, T3, T4, T5, T6, T7, T8) may have a first terminal that is a gate of the transistor, and the at least one variable capacitor (T1, T2, T3, T4, T5, T6, T7, T8) may have a second terminal that is a source/drain connection of the transistor.

In reference to the dummy wordline tracking circuitry 202, the one or more variable capacitors (T1, T2, T3, T4) may have a first terminal that is coupled to the dummy wordline (dwl). The one or more variable capacitors (T1, T2, T3, T4) may have a second terminal that is coupled to the first variable voltage source (control_1) to receive at least one control signal that switches between a first state and a second state that is different than the first state. In the first state, the one or more variable capacitors (T1, T2, T3, T4) may have a first variable capacitance value that is high in capacitance. In the second state, the one or more variable capacitors (T1, T2, T3, T4) may have a second variable capacitance value is low in capacitance.

In reference to the dummy bitline tracking circuitry 302, the one or more variable capacitors (T5, T6, T7, T8) may have a first terminal that is coupled to the dummy bitline (dbl). The one or more variable capacitors (T5, T6, T7, T8) may have a second terminal that is coupled to the second variable voltage source (control_2) to receive at least one control signal that switches between a first state and a second state that is different than the first state. In the first state, the one or more variable capacitors (T5, T6, T7, T8) may have a first variable capacitance value that is high in capacitance. In the second state, the one or more variable capacitors (T5, T6, T7, T8) may have a second variable capacitance value is low in capacitance.

In some implementations, as also shown in FIG. 4, the one or more variable capacitors (T1, T2, T3, T4, T5, T6, T7, T8) may be implemented with a transistor that is coupled together to operate as a capacitor. The transistor may be implemented with a MOSFET, such as, e.g., an n-type MOSFET (nMOSFET). However, in other scenarios, the transistor may also be implemented with a p-type MOSFET (pMOSFET). Further, the one or more variable capacitors (T1, T2, T3, T4, T5, T6, T7, T8) have a first terminal that is a gate of the transistor, and the one or more variable capacitors (T1, T2, T3, T4, T5, T6, T7, T8) may have a second terminal that is a source/drain connection of the transistor. In other implementations, the one or more variable capacitors (T1, T2, T3, T4, T5, T6, T7, T8) may be implemented with a capacitor.

Advantages of the various implementations described herein refer to using the observed behavior in the memory self-timing. The tracking circuitry 202, 302 introduces a cycle-time component (DWL rise→DBL rise) to speedup the falling edge (e.g., second transition) of DWL, while not affecting the rising edge (e.g., first transition). One way to achieve this is to connect the shorted source/drain terminals of the dummy MOSFETs to a delayed version of DWL, which serves the same purpose as CONTROL=VSS during the rise transition of DWL and CONTROL=VDD during the fall transition. Another idea to achieve the same effect is to connect DWL_TURN to the shorted source/drain of the dummy MOSFET, instead of Vss as shown in FIG. 4. Connecting DWL_TURN in this way leads to an increase in loading, and an overall point from which it turns back may be re-adjusted to a smaller number so as to match the dummy WL tracking delay. Another similar idea may be used for dummy MOSFETs to load DBL, wherein this idea may lead to further cycle-time improvement. Also, this idea may have application for pseudo 2-port memories, wherein the DWL's inability to fall quickly and completely to the Vss level after an end of first cycle and a beginning of second cycle may lead to loss of the write margin on the second cycle due to slightly smaller self-timed pulse or path (STP).

In some implementations, the self-timed path (i.e., the circuit path involved) may refer to at least one circuit path that is responsible for taking an external clock rise as input for triggering the internal memory (gtp) clock rise. The self-timed path may also refer to at least one circuit path that includes tracking the dummy bitline (DBL) and/or the dummy wordline (DWL). The self-timed path may also refer to tracking the DBL and/or DWL when it leads to closing of the internal memory (gtp) clock. In other implementations, the self-timed pulse (i.e., timing of signals) may refer to the pulse width of the internal memory (gtp) clock pulse and/or also to one or more or all of the derived internal clocks from gtp or tracking.

Figure 5:
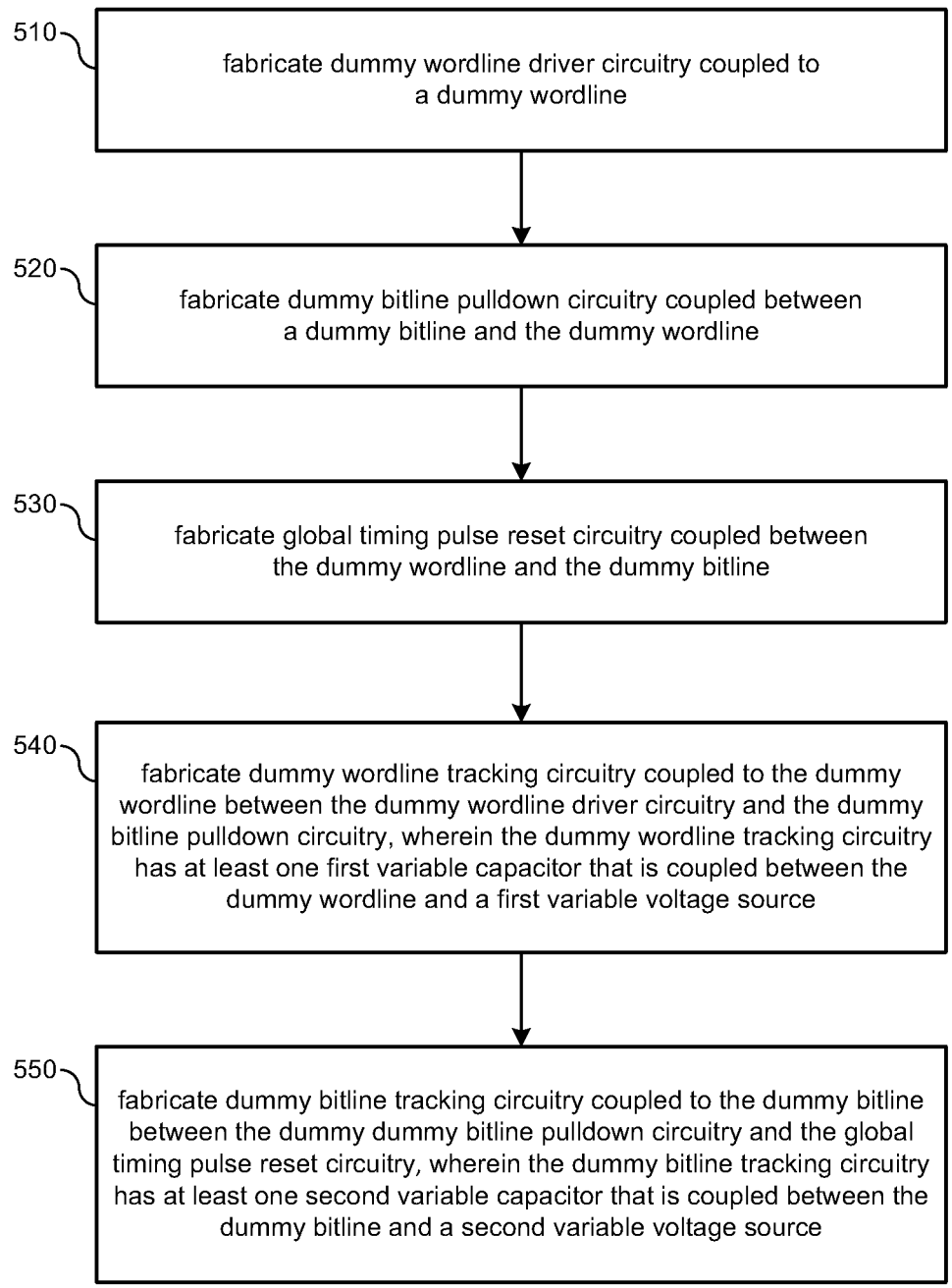
FIG. 5 illustrates a process flow diagram of a method for manufacturing an integrated circuit in accordance with various implementations described herein.

FIG. 5 illustrates a process flow diagram of a method 500 for manufacturing an integrated circuit in accordance with various implementations described herein.

It should be understood that even though method 500 may indicate a particular order of operation execution, in some cases, various certain portions of the operations may be executed in a different order, and on different systems. In other cases, additional operations and/or steps may be added to and/or omitted from method 500. Method 500 may be implemented in hardware and/or software. If implemented in hardware, the method 500 may be implemented with various circuit components, such as described herein above in reference to FIGS. 1-4. If implemented in software, method 500 may be implemented as a program or software instruction process that may be configured for implementing tracking circuitry as described herein. Also, if implemented in software, instructions related to implementing the method 500 may be stored in memory and/or a database. For instance, a computer or various other types of computing devices having a processor and memory may be configured to perform method 500.

As described and shown in reference to FIG. 5, method 500 may be used for manufacturing of fabricating an integrated circuit (IC) for tracking bias voltage behavior in various memory related applications. In some implementations, method 500 may refer to manufacturing or fabricating tracking circuitry that utilizes changes in MOSFET switching behavior with different bias voltages in memory self-timing applications.

At block 510, method 500 may fabricate dummy wordline driver circuitry that is coupled to a dummy wordline. At block 520, method 500 may fabricate dummy bitline pulldown circuitry that is coupled between a dummy bitline and the dummy wordline. At block 530, method 500 may fabricate global timing pulse reset circuitry that is coupled between the dummy wordline and the dummy bitline.

At block 540, method 500 may fabricate dummy wordline tracking circuitry that is coupled to the dummy wordline between the dummy wordline driver circuitry and the dummy bitline pulldown circuitry. The dummy wordline tracking circuitry may have at least one first variable capacitor that is coupled between the dummy wordline and a first variable voltage source. The at least one first variable capacitor may be implemented with a transistor that is coupled together to operate as a capacitor, and the at least one variable capacitor may have a first terminal that is a gate of the transistor, and the at least one variable capacitor may also have a second terminal that is a source/drain connection of the transistor. The first variable voltage source may be implemented with a variable source voltage supply (Vdd) or a variable ground voltage supply (Vss).

In some implementations, the at least one first variable capacitor may be used for switching between multiple capacitance values, and the switching may be performed dynamically. Also, the switching between multiple capacitance values may occur at any time within a memory operation cycle. In some implementations, the second terminal of the at least one first variable capacitor may be coupled to the first variable voltage source to receive a first control signal that switches between a first state and a second state that is different than the first state. In the first state, the at least one first variable capacitor may have a first variable capacitance value that is high in capacitance, and in the second state, the at least one first variable capacitor may have a second variable capacitance value is low in capacitance.

At block 550, method 500 may fabricate dummy bitline tracking circuitry that is coupled to the dummy bitline between the dummy bitline pulldown circuitry and the global timing pulse reset circuitry. The dummy bitline tracking circuitry may have at least one second variable capacitor that is coupled between the dummy bitline and a second variable voltage source. The at least one second variable capacitor may be implemented with a transistor that is coupled together to operate as a capacitor, and the at least one variable capacitor may have a first terminal that is a gate of the transistor, and the at least one variable capacitor may have a second terminal that is a source/drain connection of the transistor. The second variable voltage source may be implemented with a variable source voltage supply (Vdd) or a variable ground voltage supply (Vss).

In some implementations, the at least one second variable capacitor may be used for switching between multiple capacitance values, and the switching may be performed dynamically. Also, the switching between multiple capacitance values may occur at any time within a memory operation cycle. In some implementations, the second terminal of the at least one second variable capacitor may be coupled to the second variable voltage source to receive a second control signal that switches between a second state and a second state that is different than the first state. In the first state, the at least one second variable capacitor may have a first variable capacitance value that is high in capacitance, and in the second state, the at least one second variable capacitor may have a second variable capacitance value is low in capacitance.

Described herein are various implementations of an integrated circuit. The integrated circuit may include dummy wordline driver circuitry that is coupled to a dummy wordline. The integrated circuit may include dummy bitline pulldown circuitry that is coupled between a dummy bitline and the dummy wordline. The integrated circuit may include dummy wordline tracking circuitry that is coupled to the dummy wordline between the dummy wordline driver circuitry and the dummy bitline pulldown circuitry. The dummy wordline tracking circuitry may have one or more variable capacitors that are coupled between the dummy wordline and a variable voltage source.

Described herein are various implementations of an integrated circuit. The integrated circuit may include dummy bitline pulldown circuitry that is coupled to a dummy bitline. The integrated circuit may include global timing pulse reset circuitry that is coupled between a dummy wordline and the dummy bitline. The integrated circuit may include dummy bitline tracking circuitry that is coupled to the dummy bitline between the dummy bitline pulldown circuitry and the global timing pulse reset circuitry, The dummy bitline tracking circuitry may have one or more variable capacitors that are coupled between the dummy bitline and a variable voltage source.

Described herein are various implementations of an integrated circuit. The integrated circuit may include dummy wordline driver circuitry that is coupled to a dummy wordline. The integrated circuit may include dummy bitline pulldown circuitry that is coupled between a dummy bitline and the dummy wordline. The integrated circuit may include global timing pulse reset circuitry that is coupled between the dummy wordline and the dummy bitline. The integrated circuit may include dummy wordline tracking circuitry that is coupled to the dummy wordline between the dummy wordline driver circuitry and the dummy bitline pulldown circuitry. The dummy wordline tracking circuitry may have at least one first variable capacitor that is coupled between the dummy wordline and a first variable voltage source. The integrated circuit may include dummy bitline tracking circuitry that is coupled to the dummy bitline between the dummy bitline pulldown circuitry and the global timing pulse reset circuitry. The dummy bitline tracking circuitry may have at least one second variable capacitor that is coupled between the dummy bitline and a second variable voltage source.

It should be intended that the subject matter of the claims not be limited to the implementations and illustrations provided herein, but include modified forms of those implementations including portions of implementations and combinations of elements of different implementations in accordance with the claims. It should be appreciated that in the development of any such implementation, as in any engineering or design project, numerous implementation-specific decisions should be made to achieve developers' specific goals, such as compliance with system-related and business related constraints, which may vary from one implementation to another. Moreover, it should be appreciated that such a development effort may be complex and time consuming, but would nevertheless be a routine undertaking of design, fabrication, and manufacture for those of ordinary skill having benefit of this disclosure.

Reference has been made in detail to various implementations, examples of which are illustrated in the accompanying drawings and figures. In the following detailed description, numerous specific details are set forth to provide a thorough understanding of the disclosure provided herein. However, the disclosure provided herein may be practiced without these specific details. In some other instances, well-known methods, procedures, components, circuits and networks have not been described in detail so as not to unnecessarily obscure details of the embodiments.

It should also be understood that, although the terms first, second, etc. may be used herein to describe various elements, these elements should not be limited by these terms. These terms are only used to distinguish one element from another. For example, a first element could be termed a second element, and, similarly, a second element could be termed a first element. The first element and the second element are both elements, respectively, but they are not to be considered the same element.

The terminology used in the description of the disclosure provided herein is for the purpose of describing particular implementations and is not intended to limit the disclosure provided herein. As used in the description of the disclosure provided herein and appended claims, the singular forms "a," "an," and "the" are intended to include the plural forms as well, unless the context clearly indicates otherwise. The term "and/or" as used herein refers to and encompasses any and all possible combinations of one or more of the associated listed items. The terms "includes," "including," "comprises," and/or "comprising," when used in this specification, specify a presence of stated features, integers, steps, operations, elements, and/or components, but do not preclude the presence or addition of one or more other features, integers, steps, operations, elements, components and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context. The terms "up" and "down"; "upper" and "lower"; "upwardly" and "downwardly"; "below" and "above"; and other similar terms indicating relative positions above or below a given point or element may be used in connection with some implementations of various technologies described herein.

While the foregoing is directed to implementations of various techniques described herein, other and further implementations may be devised in accordance with the disclosure herein, which may be determined by the claims that follow.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. An integrated circuit, comprising:
    dummy wordline driver circuitry coupled to a dummy wordline;
    dummy bitline pulldown circuitry coupled between a dummy bitline and the dummy wordline; and
    dummy wordline tracking circuitry coupled to the dummy wordline between the dummy wordline driver circuitry and the dummy bitline pulldown circuitry, wherein the dummy wordline tracking circuitry has one or more variable capacitors that are coupled between the dummy wordline and a variable voltage source comprising a variable source voltage supply.

2. An integrated circuit, comprising:
    dummy wordline driver circuitry coupled to a dummy wordline;
    dummy bitline pulldown circuitry coupled between a dummy bitline and the dummy wordline; and
    dummy wordline tracking circuitry coupled to the dummy wordline between the dummy wordline driver circuitry and the dummy bitline pulldown circuitry, wherein the dummy wordline tracking circuitry has one or more variable capacitors that are coupled between the dummy wordline and a variable voltage source;
    wherein the one or more variable capacitors are used for switching between multiple capacitance values, and wherein the switching is performed dynamically.

3. The integrated circuit of claim 2, wherein the switching between multiple capacitance values occurs at any time within a memory operation cycle.

4. The integrated circuit of claim 1, wherein the one or more variable capacitors have a first terminal that is coupled to the dummy wordline.

5. An integrated circuit, comprising:
    dummy wordline driver circuitry coupled to a dummy wordline;
    dummy bitline pulldown circuitry coupled between a dummy bitline and the dummy wordline; and
    dummy wordline tracking circuitry coupled to the dummy wordline between the dummy wordline driver circuitry and the dummy bitline pulldown circuitry, wherein the dummy wordline tracking circuitry has one or more variable capacitors that are coupled between the dummy wordline and a variable voltage source;
    wherein the one or more variable capacitors have a first terminal that is coupled to the dummy wordline;
    wherein the one or more variable capacitors have a second terminal that is coupled to the variable voltage source to receive a control signal that switches between a first state and a second state that is different than the first state.

6. The integrated circuit of claim 5, wherein in the first state, the one or more variable capacitors have a first variable capacitance value that is high in capacitance, and wherein in the second state, the one or more variable capacitors have a second variable capacitance value is low in capacitance.

7. The integrated circuit of claim 1, wherein the one or more variable capacitors are implemented with a transistor that is coupled together to operate as a capacitor.

8. An integrated circuit, comprising:
    dummy wordline driver circuitry coupled to a dummy wordline;
    dummy bitline pulldown circuitry coupled between a dummy bitline and the dummy wordline; and
    dummy wordline tracking circuitry coupled to the dummy wordline between the dummy wordline driver circuitry and the dummy bitline pulldown circuitry, wherein the dummy wordline tracking circuitry has one or more variable capacitors that are coupled between the dummy wordline and a variable voltage source;
    wherein the one or more variable capacitors are implemented with a transistor that is coupled together to operate as a capacitor;
    wherein the one or more variable capacitors have a first terminal that is a gate of the transistor.

9. The integrated circuit of claim 8, wherein the one or more variable capacitors have a second terminal that is a source/drain connection of the transistor.

10. An integrated circuit, comprising:
    dummy bitline pulldown circuitry coupled to a dummy bitline;
    global timing pulse reset circuitry coupled between a dummy wordline and the dummy bitline; and
    dummy bitline tracking circuitry coupled to the dummy bitline between the dummy bitline pulldown circuitry and the global timing pulse reset circuitry, wherein the dummy bitline tracking circuitry has one or more variable capacitors that are coupled between the dummy bitline and a variable voltage source comprising a variable source voltage supply.

11. An integrated circuit, comprising:
    dummy bitline pulldown circuitry coupled to a dummy bitline;
    global timing pulse reset circuitry coupled between a dummy wordline and the dummy bitline; and
    dummy bitline tracking circuitry coupled to the dummy bitline between the dummy bitline pulldown circuitry and the global timing pulse reset circuitry, wherein the dummy bitline tracking circuitry has one or more variable capacitors that are coupled between the dummy bitline and a variable voltage source;
    wherein the one or more variable capacitors are used for dynamically switching between multiple capacitance values at any time within a memory operation cycle.

12. An integrated circuit, comprising:
    dummy bitline pulldown circuitry coupled to a dummy bitline;
    global timing pulse reset circuitry coupled between a dummy wordline and the dummy bitline; and
    dummy bitline tracking circuitry coupled to the dummy bitline between the dummy bitline pulldown circuitry and the global timing pulse reset circuitry, wherein the dummy bitline tracking circuitry has one or more variable capacitors that are coupled between the dummy bitline and a variable voltage source;
    wherein the one or more variable capacitors are implemented with a transistor that is coupled together to operate as a capacitor, wherein the one or more variable capacitors have a first terminal that is a gate of the transistor, and wherein the one or more variable capacitors have a second terminal that is a source/drain connection of the transistor.

13. An integrated circuit, comprising:
    dummy wordline driver circuitry coupled to a dummy wordline;
    dummy bitline pulldown circuitry coupled between a dummy bitline and the dummy wordline;
    global timing pulse reset circuitry coupled between the dummy wordline and the dummy bitline;
    dummy wordline tracking circuitry coupled to the dummy wordline between the dummy wordline driver circuitry and the dummy bitline pulldown circuitry, wherein the dummy wordline tracking circuitry has at least one first variable capacitor that is coupled between the dummy wordline and a first variable voltage source; and dummy bitline tracking circuitry coupled to the dummy bitline between the dummy bitline pulldown circuitry and the global timing pulse reset circuitry, wherein the dummy bitline tracking circuitry has at least one second variable capacitor that is coupled between the dummy bitline and a second variable voltage source;

wherein the first variable voltage source is a variable source voltage supply.

14. An integrated circuit, comprising:

dummy wordline driver circuitry coupled to a dummy wordline;

dummy bitline pulldown circuitry coupled between a dummy bitline and the dummy wordline;

global timing pulse reset circuitry coupled between the dummy wordline and the dummy bitline;

dummy wordline tracking circuitry coupled to the dummy wordline between the dummy wordline driver circuitry and the dummy bitline pulldown circuitry, wherein the dummy wordline tracking circuitry has at least one first variable capacitor that is coupled between the dummy wordline and a first variable voltage source; and dummy bitline tracking circuitry coupled to the dummy bitline between the dummy bitline pulldown circuitry and the global timing pulse reset circuitry, wherein the dummy bitline tracking circuitry has at least one second variable capacitor that is coupled between the dummy bitline and a second variable voltage source;

wherein the second variable voltage source is a variable source voltage supply.

15. The integrated circuit of claim 13, wherein the at least one first variable capacitor and the at least one second variable capacitor are implemented with a transistor that is coupled together to operate as a capacitor, wherein the at least one variable capacitor have a first terminal that is a gate of the transistor, and wherein the at least one variable capacitor have a second terminal that is a source/drain connection of the transistor.

16. The integrated circuit of claim 14, wherein the at least one first variable capacitor and the at least one second variable capacitor are implemented with a transistor that is coupled together to operate as a capacitor, wherein the at least one variable capacitor have a first terminal that is a gate of the transistor, and wherein the at least one variable capacitor have a second terminal that is a source/drain connection of the transistor.

\* \* \* \* \*